United States Patent [19]

Fukuhara et al.

[11] Patent Number: 4,868,394

[45] Date of Patent: Sep. 19, 1989

[54] CHARGED PARTICLE DETECTOR

[75] Inventors: Satoru Fukuhara, Kokubunji; Hiroyuki Shinada, Chofu; Hideo Todokoro, Tokyo, all of Japan

[73] Assignee: Hitachi, Ltd., Tokyo, Japan

[21] Appl. No.: 248,378

[22] Filed: Sep. 23, 1988

[30] Foreign Application Priority Data

Sep. 25, 1987 [JP] Japan ............................... 62-238918

[51] Int. Cl.⁴ .......................................... H01J 37/244
[52] U.S. Cl. .................................... 250/397; 250/305; 250/310; 313/103 CM; 313/105 CM
[58] Field of Search ...................... 250/397, 305, 310; 313/103 CM, 105 CM

[56]  References Cited

U.S. PATENT DOCUMENTS

Re. 29,500  12/1977  Hoppe .................................. 250/311
3,626,184  12/1971  Crewe .................................. 250/311
3,896,308   7/1975  Venables et al. ..................... 250/397
4,540,885   9/1985  Plies et al. .......................... 250/305

*Primary Examiner*—Jack I. Berman
*Attorney, Agent, or Firm*—Antonelli, Terry & Wands

[57]  ABSTRACT

A charged particle detector comprises a micro-channel plate for detecting charged particles secondarily generated from a specimen irradiated with a narrowly defined beam of charged particles, a signal outputting circuit for transmitting therein a signal detected by the micro-channel plate and then outputting the signal, and a processing circuit for simultaneously outputting signals of secondary charged particles generated from the specimen at the same instant of time. Preferably, the processing circuit is constructed by a vortex-shaped electrode or the combination of concentric electrode segments and delaying elements.

6 Claims, 3 Drawing Sheets

CHARGED PARTICLE DETECTOR

BACKGROUND OF THE INVENTION

The present invention relates to a charged particle detector, and more particularly to a charged particle detector which is suitable for the use in an electron beam tester device or the like and in which the improvement in high-speed response performance or characteristic is contemplated.

In place of the conventional general-purpose tester based on a probe method, an electron beam tester device (hereinafter referred to as EB tester device) utilizing a scanning electron microscope is used for measurement of internal voltages or potentials of large scale integrated (LSI) circuits. Generally, a so-called stroboscopic type EB tester device using a pulsed electron beam is dominantly employed. A stroboscopic measurement method is disclosed by, for example, U.S. Pat. No. 4,772,847 issued on Sep. 20, 1988 and entitled "Stroboscopic Type Potential Measurement Device". In the stroboscopic method, an electric potential or voltage on a specimen is measured on the basis of a signal applied to the specimen and a secondary-electron signal generated from the specimen through irradiation of the specimen with an electron beam which is pulsed with an arbitrary width in synchronism with the signal applied to the specimen. By controlling the phase of the signal applied to the specimen and the phase of the pulsed electron beam, the specimen potential changing at a high speed can be detected in a form converted into a version changing at a low speed. The pulse width of the electron beam determines the time precision of a voltage waveform measured. Therefore, the electron beam pulse width is selected to be 1/500 to 1/1000 of a pulse repetition period or approximately smaller than 1 ns. The EB tester device based on the stroboscopic method is effective for a specimen operating at a relatively short repetition period (smaller than 1 $\mu$s), for example, an LSI circuit such as a memory. However, for a specimen operating or a relatively long repetition period (larger than 10 $\mu$s), for example, a logic LSI circuit such as a gate array, the stroboscopic EB tester device brings upon a remarkable decrease in S/N since the duty of the electron beam becomes smaller than $1/10^4$. As a result, a long time is required for measurement. Therefore, the stroboscopic method is not suited to the measurement for the logic LSI circuit.

The above problem can be solved by employing an EB tester device which does not use the stroboscopic method but in which a specimen is irradiated with a DC electron beam and by developing a secondary-electron detecting system which can respond to the potential of a specimen operating at a high speed. One conventional example of such a secondary-electron detector uses a scintillator and a photomultiplier in combination. Recently, a micro-channel plate (hereinafter abbreviated to MCP) having an excellent high-speed response begins to be employed (see Nakamae et al "Semi-Spherical Decelerating Electric-Field Type Spectroscope Using MCP Detector", Data for 89th Symposium in 132nd Committee for Advancement of Science, pp. 41–44, 1984). As is disclosed in the Nakamae et al's article, the operation of the MCP requires that the earth or positive potential should be applied to a secondary-electron receiving surface of the MCP while a high positive voltage (1 KV~3 KV) is should be applied to a rear surface of the MCP. The MCP multiplies the incident secondary electrons by about $10^4$ times by the action of the high electric field and the multiplied electrons reach an anode of the MCP. Thus, an output signal to be detected is obtained at a high voltage side. Therefore, an isolation amplifier is used to take out the output signal as an analog signal at a low voltage side.

In the above-mentioned article, it is disclosed that the time response of the MCP detector depends upon the frequency characteristic of the isolation amplifier. However, the improvement up to the time response (not larger than 1 ns) of the MCP may be technically possible by the selection of high-speed LSI circuits.

The device disclosed by the article involves two critical problems. The problems will now be explained by use of FIG. 1.

A first problem concerns the behaviour of secondary electrons incident upon the front surface of the MCP, that is, a difference between travel times of the secondary electrons. Secondary electrons generated from a specimen emanate at every angle in accordance with the Lambert's cosine law. The secondary electrons are selected by a spherical energy filter (shown by reference numeral 2 in FIG. 1) and are incident upon a secondary-electron receiving surface 31 of the MCP 3 with voltage contrast information included. Therefore, secondary electrons $e_1$ emanating from the peak of the spherical energy filter 2 and secondary electrons $e_2$ emanating from the end or marginal portion of the filter 2 have different travel distances which result in a difference between arrival times. This arrival time difference is further increased when the energy distribution of secondary electrons generated is taken into consideration. This means that in the case where the specimen potential or voltage has a high-speed pulse change, a difference of travel times of secondary electrons appears as the dulled rise time of a pulse waveform detected, thereby making the faithful detection of a high-speed pulse waveform impossible.

A second problem is an impedance matching. Since the frequency of a signal detected by the device is a high frequency in order of MHz to GHz, the device should be handled as a distributed constant circuit. Therefore, it is necessary to match the characteristic impedance $Z_a$ of the anode of the MCP with the characteristic impedance $Z_o$ of a transmission line extending from the anode to the isolation amplifier. If these impedances $Z_a$ and $Z_o$ are not equal to each other, a reflected wave is generated, thereby making the faithful detection of a high-speed pulse waveform impossible.

As has been mentioned above, the problem of the difference in travel time between secondary electrons and the problem of the impedance matching affect the high-speed response performance of the secondary-electron detector using the MCP.

SUMMARY OF THE INVENTION

An object of the present invention is to provide a charged particle detector with an excellent high-speed response performance which can reduce the above-mentioned difference in travel time between secondary electrons and can remove any reflected wave resulting from the mismatching of impedance.

The above object of the present invention can be achieved by a detector construction comprising means for generating a beam of charged particles, means for irradiating a specimen with the charged particle beam in a narrowly defined form, an MCP for detecting charged particles secondarily generated from the specimen, signal outputting means for transmitting therein a signal detected by the MCP and then outputting the signal, and processing means provided between the specimen and the signal outputting means for simultaneously outputting signals of secondary charged particles generated from the specimen at the same instant of time. It is preferable to make the characteristic impedance of a signal taking-out electrode of the MCP coincident with that of a transmission line.

In a preferred embodiment, the secondary charged particle taking-out electrode in an anode of the MCP is provided with a vortex form and its characteristic impedance coincident with the characteristic impedance of the transmission line, and the secondary charged particle signal is taken out from an outer end portion of the vortex-shaped electrode.

In another embodiment, the secondary charged particle taking-out electrode in the anode of the MCP is divided into a plurality of concentric segments. Signals from the electrode segments are provided with predetermined delays by respective delaying elements and are thereafter summed to provide an output signal.

Generally, the travel time t of secondary electrons can be calculated by the following equation (1):

$$t = \sqrt{\frac{2m}{e}} \cdot \frac{\sqrt{V_o + V_a} - \sqrt{V_o}}{V_a} \cdot X \qquad (1)$$

Here, e/m is the specific charges of electrons, $V_a$ the accelerating voltage of secondary electrons, $V_o$ the initial velocity of secondary electrons, and X the travel distance.

The travel tie of secondary electrons from a spherical grid of the energy filter to the secondary-electron receiving surface of the plate-like MCP can be calculated by use of the equation (1). The travel distance $X_c$ from the center of the spherical grid and the travel distance $X_e$ from the end or marginal portion of the spherical grid have a relation of $X_e > X_c$. Accordingly, the arrival times $t_c$ and $t_e$ of secondary electrons incident upon the MCP at central and end portions thereof have a relation of $t_e > t_c$.

In the present invention, the above difference in arrival time is reduced in such a manner that the anode of the MCP is provided with a vortical electrode with a signal being taken out from an outer end portion of the vortical electrode so that a delay of propagation velocity is generated between the outer side of the electrode and the inner side thereof near the center to make the amount of that delay equal to the above-mentioned difference in travel time between secondary electrons. With such a construction, there results in that the secondary-electron signal taken out from the outer end portion of the vortical electrode does not involve the difference in travel time between secondary electrons apparently.

Further, a stripe line is used to make the characteristic impedance of the vortex electrode coincide with that of the signal transmission line. Generally, the characteristic impedance Z of the stripe line can be calculated by the following equation:

$$Z = \frac{87}{\sqrt{e_r + 1.41}} \cdot \ln\left(\frac{5.98h}{0.8W + D}\right). \qquad (2)$$

Here, $e_r$ is the specific dielectric constant of a dielectric, h the thickness of the dielectric, W the width of the stripe line, and D the thickness of the stripe line.

A secondary-electron signal free of any reflected wave can be taken out by calculating the characteristic impedance of the stripe line by means of the equation (2) and making it coincident with the characteristic impedance of the signal transmission line. A propagation delay $t_{pd}$ of the stripe line can be calculated by the following equation (3):

$$t_{pd} = 1.017 \sqrt{0.475 e_r + 0.67} \text{ [ns/ft]}. \qquad (3)$$

Therefore, it is also possible to easily make the propagation delay coincident with the above-mentioned difference in travel time between secondary electrons.

DESCRIPTION OF THE PREFERRED EMBODIMENTS

Embodiments of the present invention will now be explained in reference to the accompanying drawings.

Figure 1:
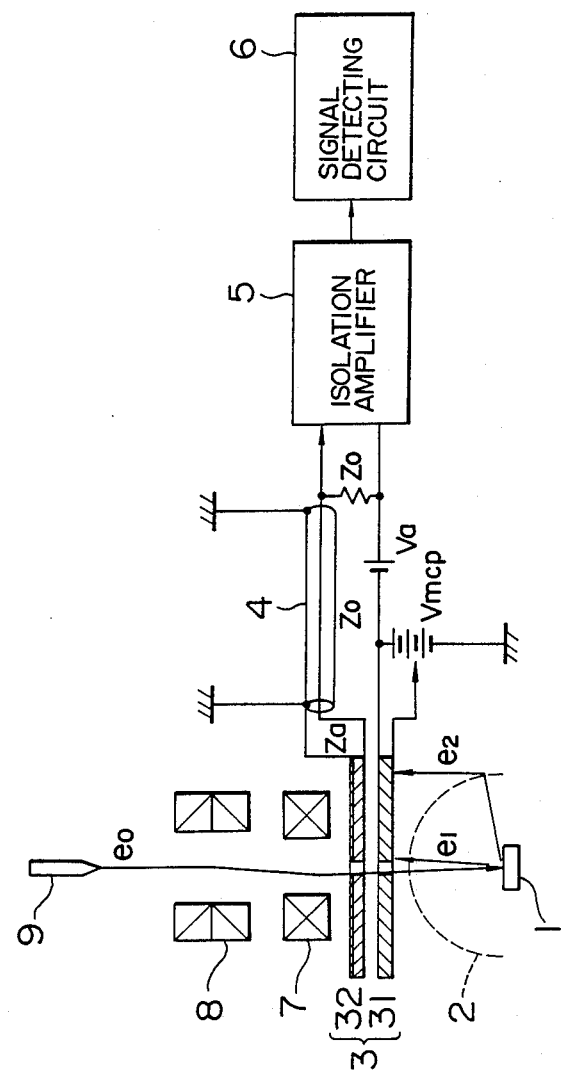
FIG. 1 is a view showing the construction of a charged particle detector according to an embodiment of the present invention.
Figure 2A:
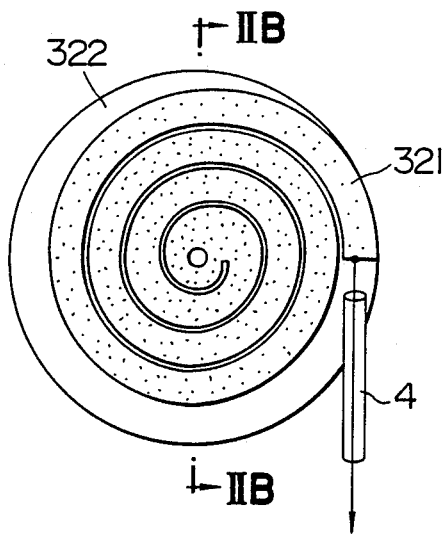
FIG. 2A is a plan view showing the structure of an anode of an MCP used in the embodiment shown in FIG. 1.
Figure 2B:
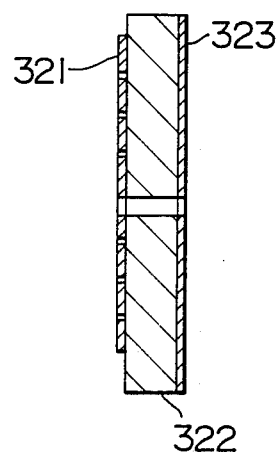
FIG. 2B is a cross section taken along line IIB—IIB in FIG. 2A.

FIG. 1 is a view showing the construction of a first embodiment of the present invention. FIGS. 2A and 2B show the configuration or structure of an anode in a micro-channel plate (MCP) shown in FIG. 1. More especially, FIG. 2A is a plan view of the anode viewed from the side of a vortical electrode thereof and FIG. 2B is a cross section of the anode taken along line IIB—IIB in FIG. 2A. A primary electron beam $e_o$ emitted from an electron gun 9 is incident upon a specimen 1 by the action of an XY deflector 8 for permitting selective irradiation of any location on the specimen 1 with the primary electron beam $e_o$ and the action of an objective lens 7 for focusing the primary electron beam into any diameter or a narrowly defined form. Secondary electrons are generated from the specimen 1 and go straight toward a spherical energy filter 2. The specimen 1 is supplied with any voltage. Therefore, the secondary electrons passed through the energy filter 2 becomes incident upon a secondary-electron receiving surface 31 of an MCP 3 with potential or voltage contrast information included therein. As is apparent from the illustration in FIG. 1, the secondary electrons $e_1$ incident upon the vicinity of the center of the secondary-electron receiving surface 31 of the MCP 3 and the secondary electrons $e_2$ incident upon an end or outer periphery portion thereof have different travel distances from the energy filter 2 and hence the arrival times of secondary-electron signals incident upon an anode 32 of the MCP 3 have fluctuations. On the other hand, the anode 32 has a structure as shown in FIGS. 2A and 2B. Namely, the anode 32 includes an electrode 323 to be grounded on a rear surface and an electrode 321 for take-out of secondary-electron signal on a front surface with a dielectric 322 being sandwiched therebetween, and the electrode 321 is shaped into a vortex form starting from a center thereof and with a secondary-electron signal being taken out from an outer end portion of the vortex-shaped (vortical) electrode 321. In such a structure, the amount of propagation delay from the center of the electrode 321 to the end portion thereof is calculated in accordance with the equation (3) and is made equal to the difference in travel time between secondary electrons calculated in accordance with the equation (1). Thus, there results in that the secondary-electron signals are apparently incident upon or reach the signal taking-out point of the vortical electrode 321 of the anode 32 at the same instant of time. Further, the characteristic impedance $Z_a$ of the vortical electrode 321 is made coincident with the characteristic impedance $Z_o$ of a transmission line 4. Therefore, no reflected wave is generated and hence the obtained secondary-electron signal includes a faithful voltage contrast signal. This secondary-electron signal is supplied to a signal detecting circuit 6 at a low voltage side through an impedance-matched high-speed isolation amplifier 5 and is taken out therefrom as a voltage contrast signal. In FIG. 1, reference symbol $V_{mcp}$ designates a high voltage source for the MCP 3, and symbol $V_a$ a DC power source for the anode 32.

Next, a second embodiment of the present invention will be explained by use of FIG. 3.

Figure 3:
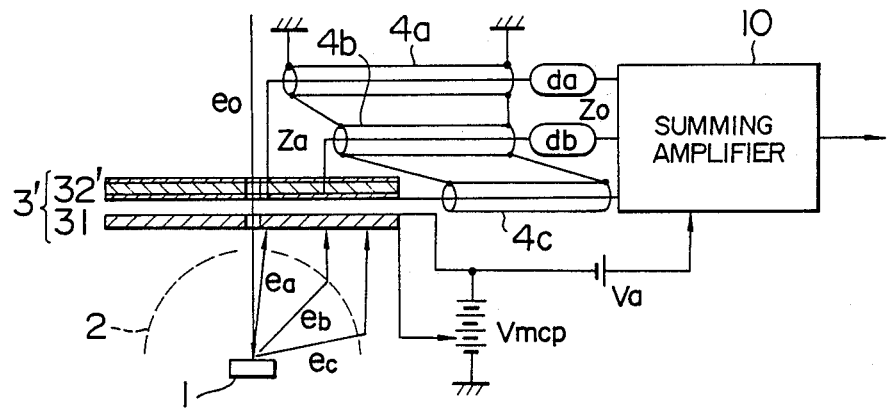
FIG. 3 is a view showing the construction of a charged particle detector according to another embodiment of the present invention.

FIG. 3 shows a main part of a detector according to the second embodiment and the other part not shown has the same construction as that shown in FIG. 1. Secondary electrons generated from a specimen 1 go straight toward a spherical energy filter 2 and is incident upon an MCP 3', as shown in FIG. 3, with potential or voltage contrast information included therein. Secondary electrons $e_a$ incident upon the vicinity of the center of the MCP 3', secondary electrons $e_c$ incident upon the outer periphery of the MCP 3' and secondary electrons $e_b$ incident upon the intermediate portion therebetween have their travel distances or times which differ from each other depending on distances from the energy filter 2 to the front surface of the MCP 3', and hence the arrival times of secondary electron signals incident upon an anode 32' of the MCP 3' have fluctuations. In the present embodiment, the anode 32' of the MCP 3' is divided into three concentric segments which are electrically isolated from each other. The characteristic impedance $Z_a$ of each anode segment is determined by use of the equation (2) so as to be equal to the characteristic impedance $Z_o$ of a transmission line 4a, 4b, 4c and the characteristic impedance $Z_o$ of a summing amplifier 10. As a result, any undesired reflected wave can be removed.

Figure 4A:
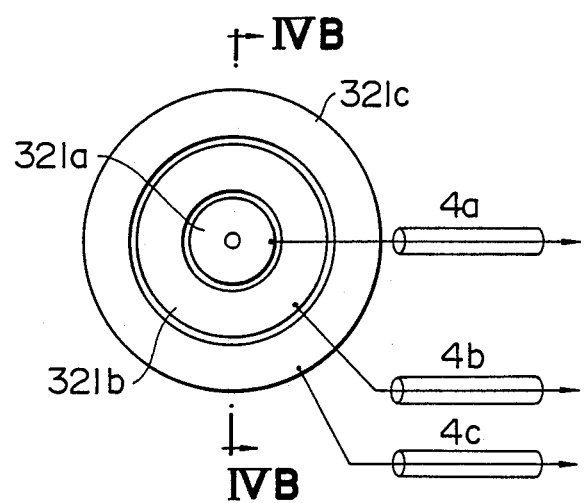
FIG. 4A is a plan view showing the structure of an anode of an MCP used in the embodiment shown in FIG. 3.
Figure 4B:
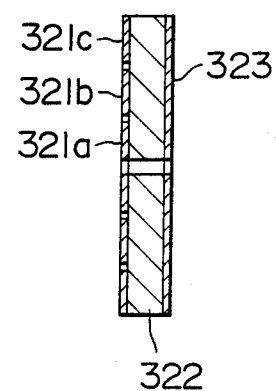
FIG. 4B is a cross section taken along line IVB—IVB in FIG. 4A.

FIG. 4A is a plan view of the anode 32' and FIG. 4B is a cross section taken along line IVB—IVB in FIG. 4A. The anode 32' is divided into segments 321a, 321b and 321c. Delaying elements $d_a$ and $d_b$ are connected to the anode segments 321a and 321b, respectively. The travel times $t_a$, $t_b$, and $t_c$ of the secondary electrons $e_a$, $e_b$ and $e_c$ and calculated in accordance with the equation (1) like the first embodiment have a relation of $t_a < t_b < t_c$. Therefore, if the delay amounts of the delaying elements $d_a$ and $d_b$ are set to be equal to $t_c - t_a$ and $t_c - t_b$, respectively, secondary-electron signals from the anode segments 321a, 321b and 321c reach input stages of the summing amplifier 10 at the same instant of time. Accordingly, an output signal of the summing amplifier 10 is free of any fluctuation of travel times of secondary electrons.

In the present embodiment, the anode of the MCP has been divided into three segments. A higher precision can be obtained with the increased number of anode segments.

The output signal from the summing amplifier 10 is inputted to the isolation amplifier in the same manner as that in the first embodiment and a faithful voltage contrast signal is taken out by the signal detecting circuit.

The foregoing embodiments have been explained in conjunction with the voltage contrast of secondary electrons. However, it is apparent that the similar procedure can also be applied to the high-speed response characteristic of secondary electrons and to other charged particles such as secondary ions.

According to the present invention, any fluctuation of travel times of secondary charged particles generated from a specimen can be removed and the impedance matching of a signal transmission line is possible. As a result, it is possible to detect a faithful secondary charged particle signal which responds to the high-speed pulse change of a specimen voltage or potential.

We claim:

1. A charged particle detector comprising:
   means for generating a beam of charged particles;
   means for irradiating a specimen with the charged particle beam in a narrowly defined form;
   a micro-channel plate for detecting charged particles secondarily generated from said specimen;
   signal outputting means for transmitting therein a signal detected by said micro-channel plate and then outputting the signal; and
   processing means provided between said specimen and said signal outputting means for simultaneously outputting signals of secondary particles generated from said specimen at the same instant of time and detected by different portions of said micro-channel plate at different instants of time.

2. A charged particle detector according to claim 1, further comprising means for selecting the energy of the secondary charged particles generated from said specimen, the energy-selected secondary charged particles being transmitted to said micro-channel plate.

3. A charged particle detector according to claim 1, wherein said processing means is constructed so that an electrode for take-out of secondary charged particle signal in an anode of said micro-channel plate is shaped into a vortex form and a signal of secondary charged particles is taken out from an outer end portion of the vortex-shaped electrode.

4. A charged particle detector according to claim 3, wherein the characteristic impedance of said vortex-shaped electrode is matched with that of a transmission line for signal take-out.

5. A charged particle detector according to claim 5, wherein said processing means is constructed so that an electrode for take-out of secondary charged particles in an anode of said micro-channel plate is divided into a plurality of concentric segments and signals from the respective electrode segments are summed after predetermined time delays.

6. A charged particle detector according to claim 5, wherein the characteristic impedance of the electrode segment is matched with that of a transmission line for signal take-out.

* * * * *